United States Patent
Lance et al.

(10) Patent No.: US 11,869,998 B2
(45) Date of Patent: Jan. 9, 2024

(54) CROSS-TIED PHOTOVOLTAIC ARRAY

(71) Applicant: SunPower Corporation, San Jose, CA (US)

(72) Inventors: Tamir Lance, Los Gatos, CA (US); Hoi Hong Ng, San Jose, CA (US); David Okawa, Redwood City, CA (US); Adam Rothschild Hoffman, Oakland, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 1 day.

(21) Appl. No.: 17/703,376

(22) Filed: Mar. 24, 2022

(65) Prior Publication Data
US 2022/0310860 A1    Sep. 29, 2022

Related U.S. Application Data

(60) Provisional application No. 63/165,283, filed on Mar. 24, 2021.

(51) Int. Cl.
*H01L 31/05* (2014.01)
*H01L 31/0475* (2014.01)
*H01L 31/02* (2006.01)

(52) U.S. Cl.
CPC .... *H01L 31/0504* (2013.01); *H01L 31/02021* (2013.01); *H01L 31/0475* (2014.12)

(58) Field of Classification Search
CPC ............. H01L 31/0504; H01L 31/0475; H01L 31/02021
See application file for complete search history.

(56) References Cited

U.S. PATENT DOCUMENTS

| | | |
|---|---|---|
| 4,239,555 A | 12/1980 | Scharlack et al. |
| 4,612,408 A | 9/1986 | Moddel et al. |
| 4,754,544 A | 7/1988 | Hanak |
| 5,409,549 A | 4/1995 | Mori |
| 5,972,732 A | 10/1999 | Gee et al. |
| 7,095,050 B2 | 8/2006 | Wanlass et al. |
| 8,362,355 B2 | 1/2013 | Pettersson |

(Continued)

FOREIGN PATENT DOCUMENTS

| | | |
|---|---|---|
| CN | 104241431 B | 10/2016 |
| EP | 3340318 A1 | 6/2018 |
| WO | 2011084053 A2 | 7/2011 |

OTHER PUBLICATIONS

Rakeshkumar V. Mahto et al., Improving performance of photovoltaic panel by reconfigurability in partial shading condition, Journal of Photonics for Energy, vol. 10(4), Oct.-Dec. 2020, pp. 042002 1-042002 15.

(Continued)

*Primary Examiner* — Tae-Sik Kang
(74) *Attorney, Agent, or Firm* — GRASSO PLLC

(57) ABSTRACT

Strings of interconnected PV cells within a PV laminate or module are themselves connected by one or more cross-ties. These cross-tied strings can be oriented in a straight or serpentine fashion and spacings between adjacent strings may differ depending upon whether a cross-tie connection is present or not. The PV cells may be multi-diode PV cells having a shared substrate. PV cells connected by a cross-tie are connected in parallel and have a shared voltage potential.

20 Claims, 14 Drawing Sheets

(56) References Cited

U.S. PATENT DOCUMENTS

| | | | |
|---|---|---|---|
| 9,496,437 | B2 | 11/2016 | Harley et al. |
| 9,893,222 | B2 | 2/2018 | Harley et al. |
| 9,947,820 | B2 | 4/2018 | Morad et al. |
| 10,205,044 | B2 | 2/2019 | Bett et al. |
| 10,608,133 | B2 | 3/2020 | Harley et al. |
| 2005/0183765 | A1 | 8/2005 | Ho et al. |
| 2012/0138132 | A1* | 6/2012 | Guha .............. H01L 21/02642 136/255 |
| 2012/0305047 | A1 | 12/2012 | Taira et al. |
| 2014/0124014 | A1 | 5/2014 | Morad et al. |
| 2015/0027530 | A1* | 1/2015 | Kim .................... B29C 48/92 136/256 |
| 2015/0162458 | A1* | 6/2015 | Vatelmacher ............ H02J 1/12 307/77 |
| 2015/0280641 | A1 | 10/2015 | Garg et al. |
| 2015/0372178 | A1 | 12/2015 | Jones-Albertus et al. |
| 2016/0284909 | A1 | 9/2016 | Harley et al. |
| 2016/0285272 | A1 | 9/2016 | Arditi et al. |
| 2017/0279002 | A1 | 9/2017 | Julian et al. |
| 2017/0279402 | A1 | 9/2017 | Schmaelzle et al. |
| 2018/0366604 | A1 | 12/2018 | Morad et al. |
| 2019/0312156 | A1 | 10/2019 | Lu et al. |
| 2020/0279967 | A1 | 9/2020 | Harley et al. |

OTHER PUBLICATIONS

J.W. Bishop, Computer simulation of the effects of electrical mismatches in photovoltaic cell interconnection circuits, Solar Cells, vol. 25 issue 1, Oct. 1988, pp. 73-89.

Vishnu P. Madhanmohan et al., Enhanced performance of partially shaded photovoltaic arrays using diagonally dispersed total cross tied configuration, Energy Sources, Part A: Recovery, Utilization, and Environment Effects, Sep. 29, 2020, pp. 1-19.

S. Malathy et al., Shade resilient total cross tied configurations to enhance energy yield of photovoltaic array under partial shaded conditions, Emerging Trends in Computing and Expert Technology COMET 2019 Lecture Notes on Data Engineering and Communication Technologies, vol. 35, Jul. 11, 2019, pp. 122-133.

Nalin K. Gautam et al., Reliability evaluation of solar photovoltaic arrays, Solar Energy, vol. 72, issue 2, Feb. 2002, pp. 129-141.

Hans S. Rauschenbach, Solar Cell Array Design Handbook: The Principles and Technology of Photovoltaic Energy Conversion, Springer, 1980, pp. 549.

Andrew M. Gabor, et al., Mini-Monolithic Module Development Using Small Wraparound Cells, 17th European Photovoltaic Solar Energy Conference, Oct. 22-26, 2001, Munich Germany.

* cited by examiner

FIG. 6

CROSS-TIED PHOTOVOLTAIC ARRAY

RELATED APPLICATION

This application claims priority to U.S. provisional application 63/165,283, which was filed on Mar. 24, 2021 and is entitled Cross-Tied Photovoltaic Array. The '283 application is incorporated herein, by reference, in its entirety.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

PV cells may be positioned together on a PV laminate or PV module in one-dimensional and two-dimensional arrays, where a PV module is a PV laminate with supporting power circuitry. Following fundamental rules of electricity, series connections of these PV cells would be additive as to voltage and shared as to current while parallel connections of these PV cells would be additive as to current and shared as to voltage.

When shading is experienced at a PV laminate or a PV module the outputs of the PV cell experiencing the shading will be impacted and so too will the performance of the PV laminate or PV module. This shading can move across the surface of the PV laminate or PV module and impact different combinations of PV cells of the PV laminate or PV module and have varying impact on total output.

BRIEF DESCRIPTION OF THE DRAWINGS

FIG. 6 illustrates tables showing cell numbering and module layout, which may be employed for PV module management and/or design and as may be employed according to some embodiments.

DETAILED DESCRIPTION

Figure 1:
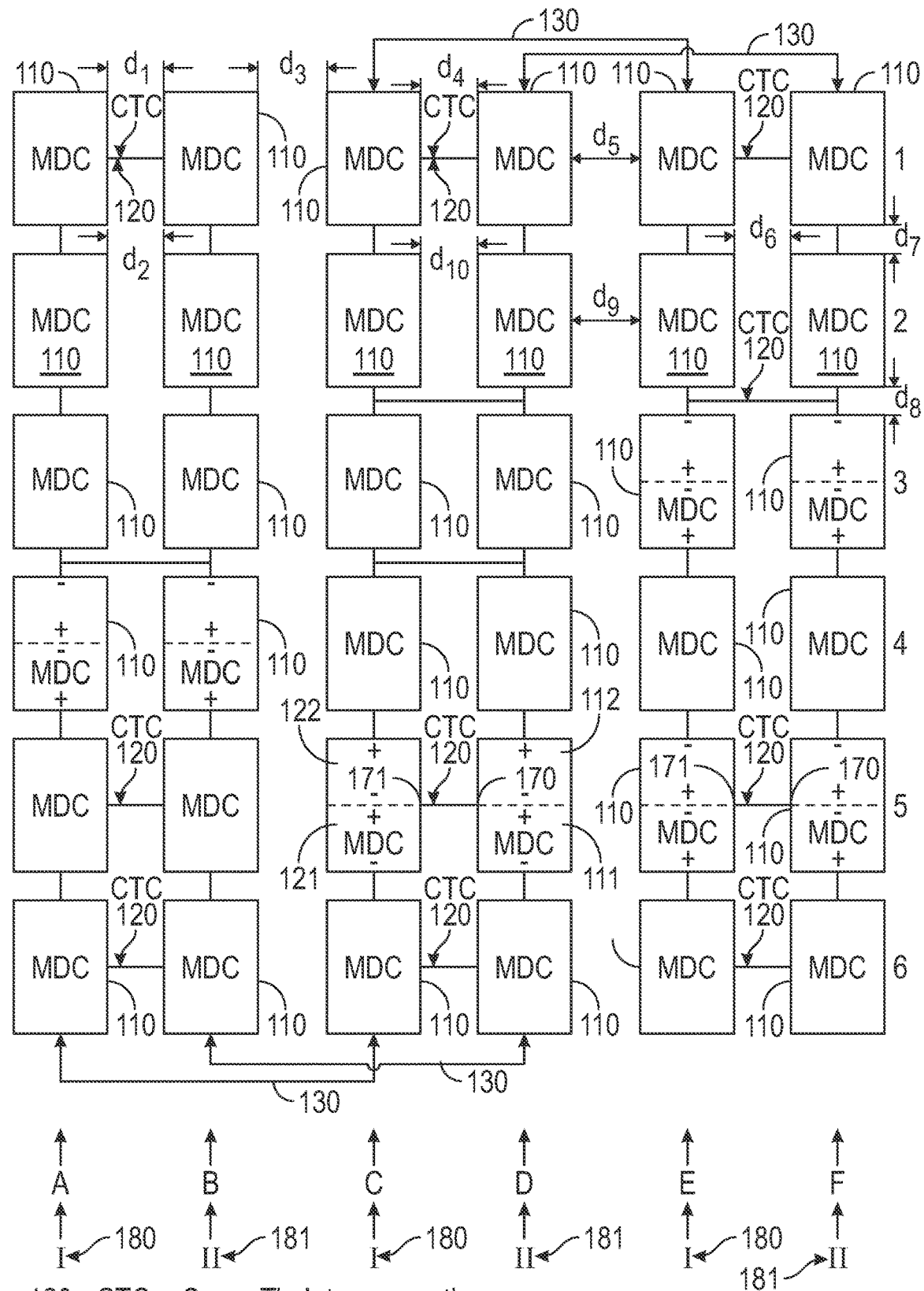
FIG. 1 illustrates two strings of multi-diode PV cells aligned in a serpentine fashion and forming a two-dimensional array of multi-diode PV cells, with cross-ties between a portion of the multi-diode PV cells, as may be employed according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112(f) for that unit/component.

"First," "Second," etc. As used herein, these terms are used as labels for nouns that they precede, and do not imply any type of ordering (e.g., spatial, temporal, logical, etc.). For example, reference to a "first" cross-tie connection does not necessarily imply that this cross-tie connection is the first cross-tie connection of a PV module or array of PV cells in a sequence, instead the term "first" is used to differentiate this cross-tie connection from another cross-tie connection (e.g., a "second" cross-tie connection).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Some embodiments can serve to further group PV cells, already interconnected as a string of PV cells, via cross-tie connections between nearby PV cells of different strings of PV cells. In other words, strings of sequential PV cells, which may be along a single line and/or in a serpentine fashion, may have individual PV cells of the string connected by a cross-tie to another PV cell of a nearby PV string. This cross-tie can serve to promote a shared voltage between the two tied PV cells. This shared voltage can allow for tighter spacing between these two or more cross-tied PV cells and thereby a closer spacing between the PV strings to which the cross-tied PV cells are a part of.

To account for PV arcing, design standards for PV modules limit the distance between strings of PV cells within the PV modules based on the potential difference between cells string-to-string. As such, this causes additional "white space" within the PV modules which reduces the overall output of the PV module as these areas are not covered by PV cells. Accordingly, embodiments may serve to reduce the distance between cells within a module such that the cells occupy a greater amount of the module overall size. This take up of white space or other unused space can lead to an overall greater output of the module because more PV cell surface is present on the PV laminate or PV module.

The present disclosure provides various instances of how distances between PV cells can be reduced from 2 mm to 0.5 mm, for example, or other reductions in spacing. By reducing these spacings between PV cells, as noted above, the percentage of overall PV cell area on a PV laminate would be increased. For example, rather than having PV cell coverage of 95% of a PV laminate, PV cell coverage can be increased to 96%-98% of the PV laminate or PV module. This increased amount of PV cell coverage would, therefore, provide additional output when compared with a PV laminate having less PV cell coverage, e.g., 94%, 92%, etc.

In addition to having a benefit of increasing the density of PV cells on a PV laminate, cross-tie connections at the PV cell level of adjacent strings can also serve to keep connected cells electrically in sync with each other. In other words, for example, during a shading event, PV cells that are connected with cross-ties can be more likely to share the same outputs and efficiencies during the event than adjacent PV cells that are not also cross-tied to each other. Moreover, adjacent strings of PV cells that are also cross-tied at the PV cell level can experience closer tolerances from string to string, which can lead to better efficiencies.

Cross-ties, as used herein, should be understood to mean a physical connection electrically connecting PV cells of different strings. These cross-ties can be between multi-diode PV cells themselves as well as interconnects between multi-diode PV cells and interconnects between single-diode PV cells. A cross-tie connection should be understood to mean a physical electrical connection such as a trace, wire, solder joint, reconnectable electrical connection, or other connections sized and positioned to provide electrical connection between points.

Accordingly, cross-tie groupings can experience shared voltages and in so doing may permit a decrease in the spacing between columns or rows of PV cells of a PV laminate or a PV module (i.e., a PV laminate with supporting power electronics) because of the absence of a meaningful voltage differential between adjacent PV cells. In other words, PV cells that are cross-tied together should be considered to have a parallel connection between them. This parallel connection provides a shared voltage via the CTC. Also, as noted above, embodiments may also improve shading performance of a PV laminate or PV module through the number and location of cross-tie connections of PV cells of the PV laminate or the PV module. As also noted above, and as a further potential exemplary benefit, embodiments may also improve performance of a PV laminate or PV module when cracked PV cells are present, via the amount and location of cross-tie connections of PV cells of the PV laminate or the PV module.

Throughout this disclosure PV laminate and PV module may be interchanged with each other. PV laminate is intended to mean a multilayered sheet with at least a layer of one PV cell and a transparent surface layer protecting the PV cell. PV module is intended to mean a PV laminate with supporting power circuitry, such as an inverter or converter, or output resistor, or other power management circuit topology. In the claims, PV module should be interpreted as a PV laminate with at least some power management circuit.

The PV cells of embodiments may be single-diode photovoltaic cells as well as multi-diode photovoltaic cells. Multi-diode cells may have a single or multiple scribed cleave lines and may reside on a shared substrate. Examples of multi-diode cells may be found at U.S. Pat. No. 10,608,113, which is incorporated by reference. Strings should preferably contain either single-diode PV cells or multi-diode PV cells to avoid mismatch (e.g., electrical) issues. Furthermore, in some embodiments, PV modules preferably contain either all single-diode PV cells or all multi-diode PV cells, having the same number of sub-cells- to avoid mismatch issues.

Embodiments may use and/or benefit from reduced electrical interconnection sizing because of lower current flows through a PV laminate or PV module comprising the cross-tied PV cells taught herein. As is known, current is squared for purposes of calculating resistance power losses so cutting current in half or by another amount will result in a 75% (or another amount) reduction in resistive losses. This reduced interconnection sizing requirement may reduce system weight and/or may also improve electrical transfer efficiencies of some embodiments.

Embodiments may also use and/or benefit from tighter spacing tolerances between PV cells having the same electric potential. The tighter tolerances may result from reduced likelihood of arcing or other shorting because adjacent PV cells reside at the same electrical potential. Accordingly, and for example, as seen in FIG. 1, the spacing $d_1$ and $d_4$ and $d_6$ may be narrower than the spacing $d_3$ and $d_5$ because of the cross-tie interconnectors 120 linking PV cells of adjacent strings I and II. The spacings $d_1$, $d_4$, and $d_6$ may preferably be less than 2.0 mm, sometimes 0.5 mm or less in some embodiments.

Figure 16:
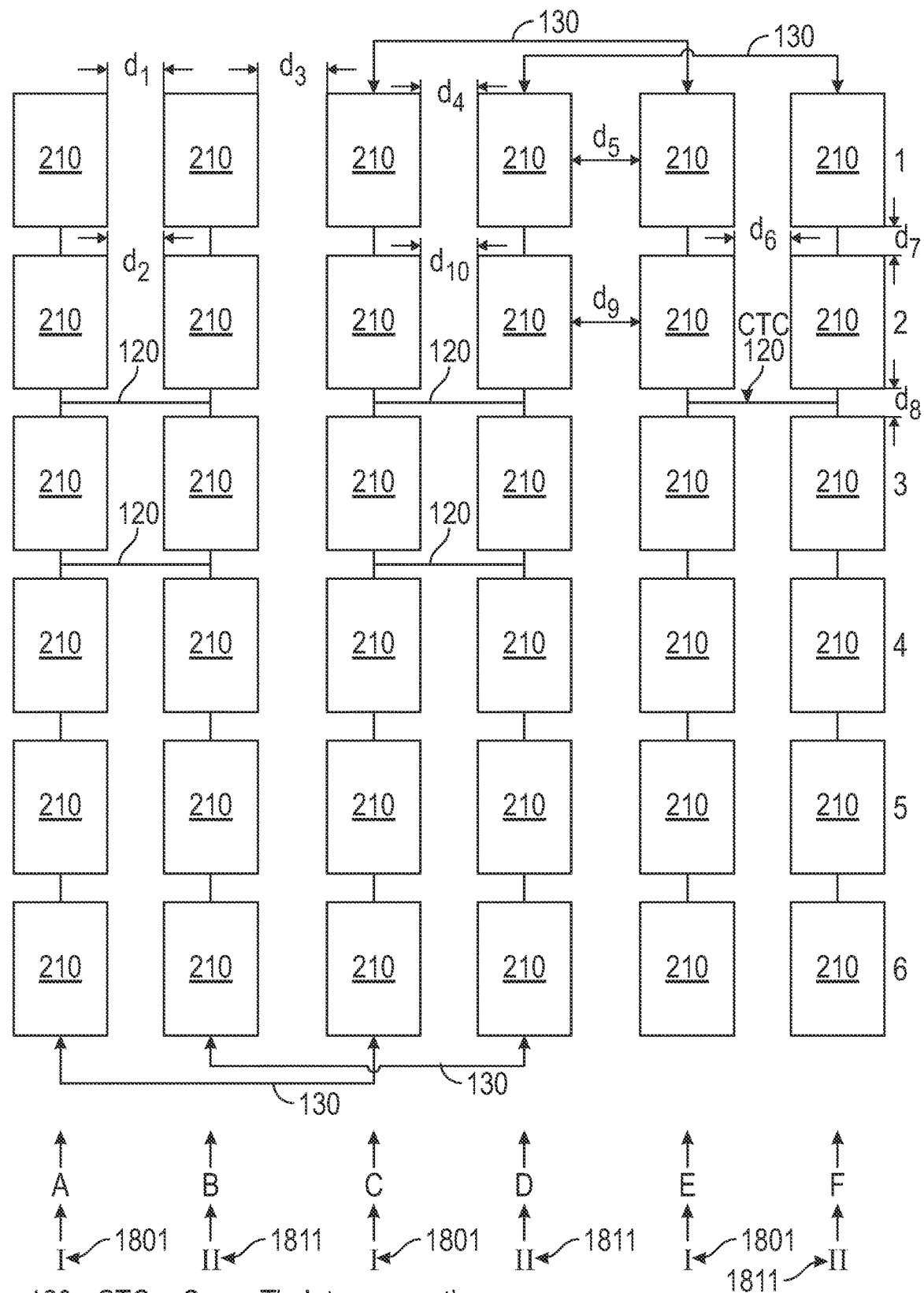
FIG. 16 illustrates two strings of single-diode PV cells aligned in a serpentine fashion and forming a two-dimensional array of single-diode PV cells, with cross-ties between interconnects of the single-diode PV cells, as may be employed according to some embodiments.

In some embodiments, strings of PV cells may snake back and forth from edge to edge of a PV laminate or PV module, i.e., have a serpentine layout. These strings may be two, three or more abreast of each other as they turn back and forth across the PV laminate or the PV module. Each leg of such a serpentine string orientation may have a first minimum spacing between other legs of the string and a second, and larger, minimum spacing between the leg itself and other PV cells that are not part of the leg. FIG. 1 shows two strings of PV cells in a serpentine orientation. The serpentine orientation has three legs, A-B, C-D, and E-F. The spacing between A-B may be different and smaller than the spacing between B-C because A-B is on a first leg while B-C represents PV cells of two different legs of the serpentine strings I (180) and II (181). FIG. 16 also shows two strings of PV cells in a serpentine orientation. These PV cells being single-diode PV cells. The serpentine orientation, like in FIG. 1, has three legs, A-B, C-D, and E-F. The spacing between A-B may be different and smaller than the spacing between B-C because A-B is on a first leg while B-C represents PV cells of two different legs of the serpentine strings I (1801) and II (1811).

Figure 2:
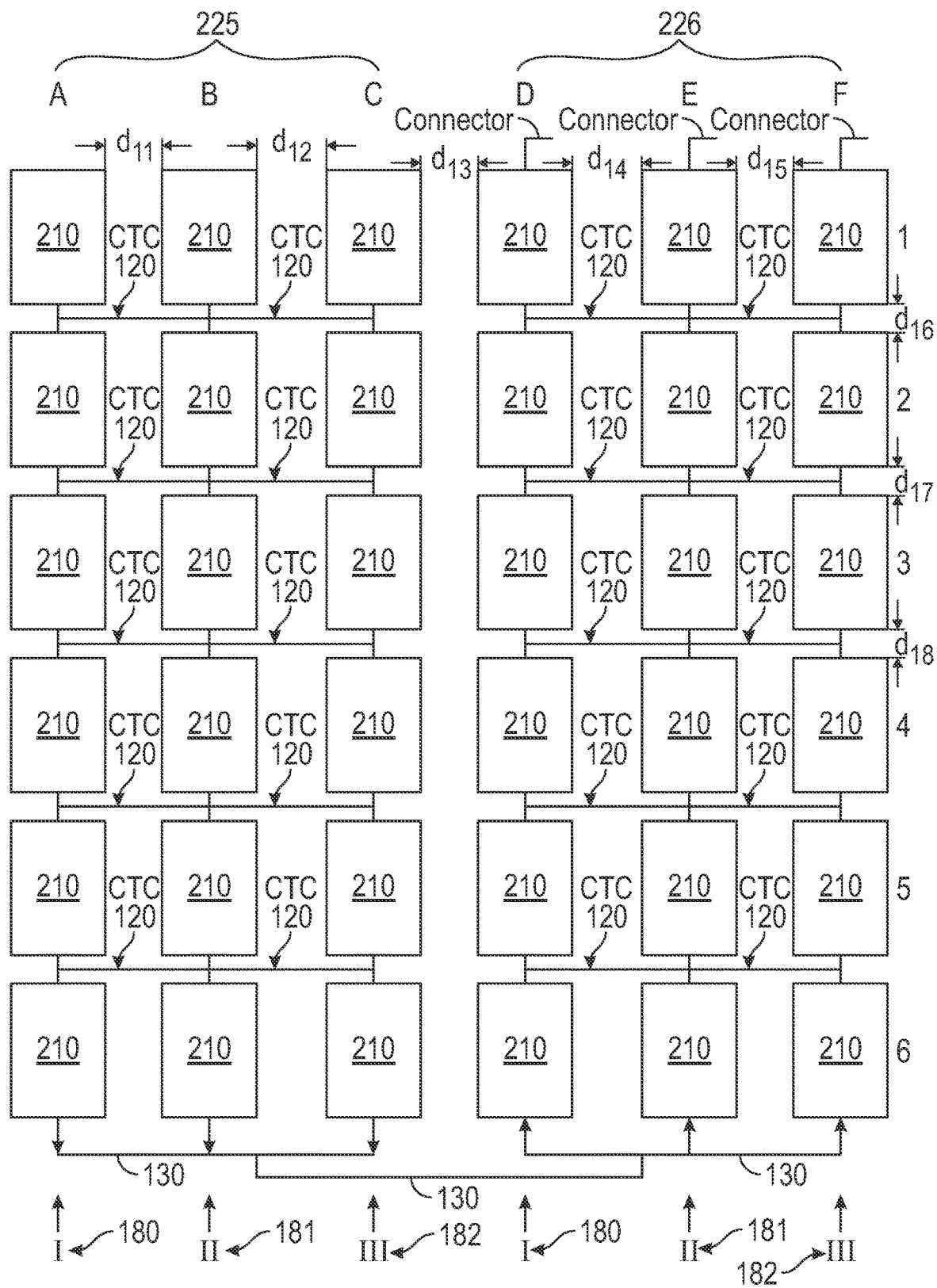
FIG. 2 illustrates three strings of single-diode PV cells aligned in a U-shaped fashion and forming a two-dimensional array of single-diode PV cells, with cross-ties between a portion of the PV cells, as may be employed according to some embodiments.

FIG. 2 shows three strings (180, 181, and 182) of PV cells in a serpentine orientation. This serpentine orientation has two legs A-C (225) and D-F (226). The spacing $d_{11}$, $d_{12}$, $d_{14}$ and $d_{15}$ may be similar or identical in embodiments and the spacing $d_{13}$ may be larger in embodiments. These spacings, $d_{11}$-$d_{15}$ may however, each be different or sometimes may be similar depending upon particular characteristics and/or uses of a particular PV laminate.

Figure 3:
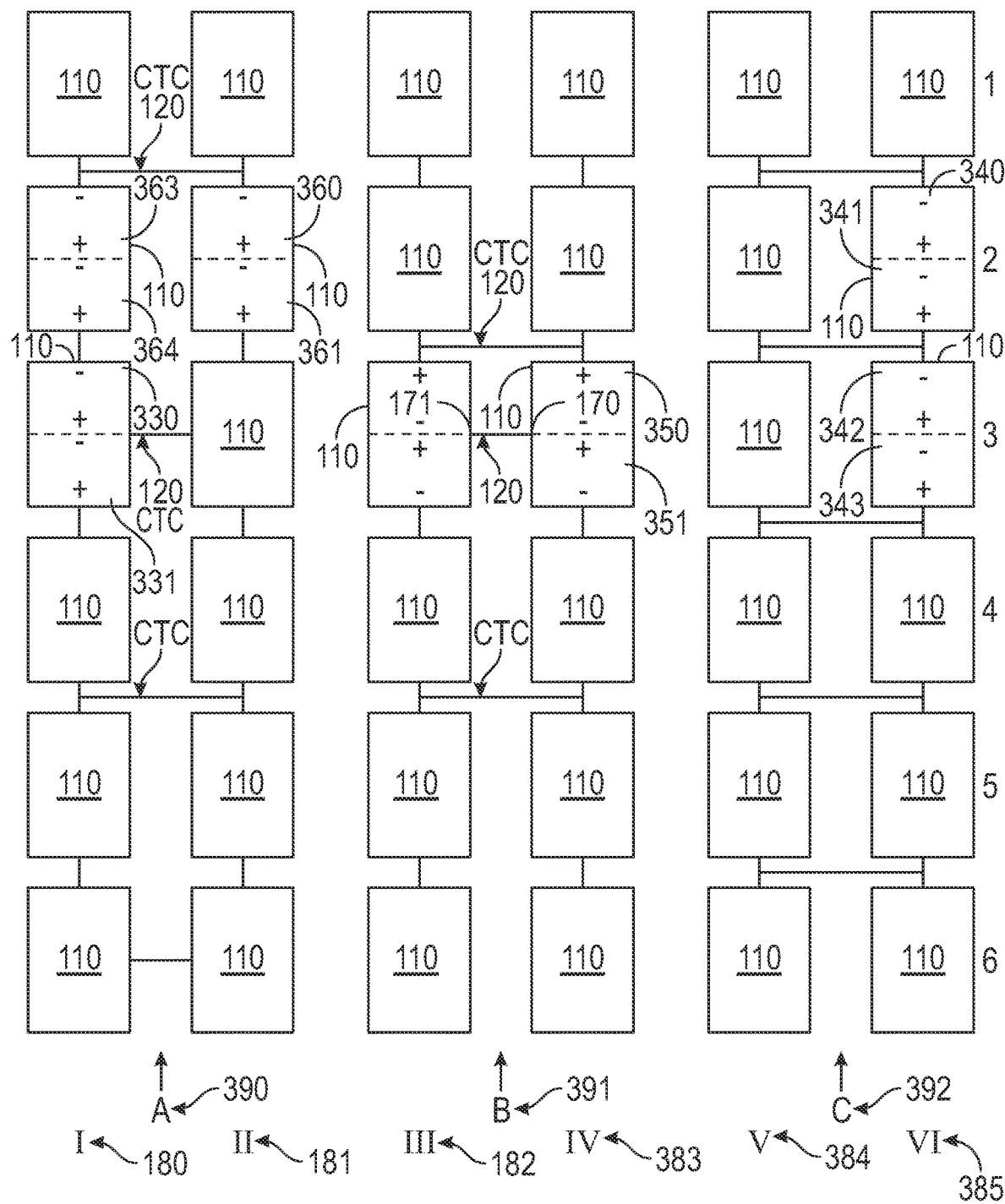
FIG. 3 illustrates six strings of PV cells forming a two-dimensional array of PV cells, with cross-ties between a portion of the PV cells and a portion of the PV cell interconnects, as may be employed according to some embodiments.

PV cells of one or more adjacent strings of these PV cells may be cross-tied to each other and in so doing share a voltage potential with other PV cells that are also cross-tie interconnected with it. As shown herein, these cross-tie interconnections (CTC) may be between PV cells as well as between interconnections between PV cells. When interconnections between PV cells are also cross-tied, the polarity of adjoining cells is parallelized so that the negative connection of one cell of adjoining cells is tied to the negative connection of the other adjacent adjoining cross-tied cell and the positive connection of one cell of adjoining cells is tied to the positive connection of the other adjacent adjoining cross-tied cell. FIG. 3 at columns A and B (legs A 390 and B 391) show PV cell interconnections also cross-tied to each other while FIG. 1 at A1 and B1 show PV cells of the same leg with cross-tie interconnections.

In some embodiments the location of cross-tie interconnections can serve to reduce the impact of shading or other drops in sunlight as well as local degradation resulting in other PV cell voltage variance, perhaps linked to non-uniform cell production. For example, when max current is reduced by a percentage on a first PV cell of a string of PV cells, but the remainder of the first PV cell is not reduced, the presence of cross-ties to a second PV cell can serve to balance the reduced current against the portion of the first PV cell operating at closer to max current and thereby improve the overall performance of the first PV cell. Furthermore, if serial strings are cross-tied, an impact on one PV cell of a string does not necessarily impact the performance of the remainder of the PV cells on the string. Likewise, when a PV cell of adjacent PV strings are impacted due to shading or other performance hinderance, a cross-tie to the string with its own impacted PV cells can still provide for improved performance provided that the impacted cells in each PV string are not the ones cross-tied to each other.

For example, if PV cell 110 at A1 (string I, leg A) and PV cell 110 at B5 (string II, leg B) of FIG. 1 were deleteriously impacted their cross-ties to the adjacent PV cell string would serve to reduce the deleterious impact. However, if PV cell 110 at A2 and PV cell 110 at B2 of FIG. 1 were each deleteriously impacted then the entire PV cell string (I (180) and II (181)) would be impacted by a reduction in performance because of the cross-tie between PV cell 110 at A2 and PV cell 110 at B2 of FIG. 1. Indeed, in certain circumstances if PV cell 110 at A2 and PV cell 110 at B2 were both impacted by large enough performance inhibitors a reverse bias in the PV cell string I (180) and II (181) of FIG. 1 can result. Cross tying, therefore, can reduce the likelihood that an impacted cell on each string can serve to impact entire PV cell strings of a PV module or PV laminate because only when two cross-tied PV cells of adjacent strings are impacted with the PV strings performance degrade consistent with the performance loss of the impacted PV cell.

Figure 4:
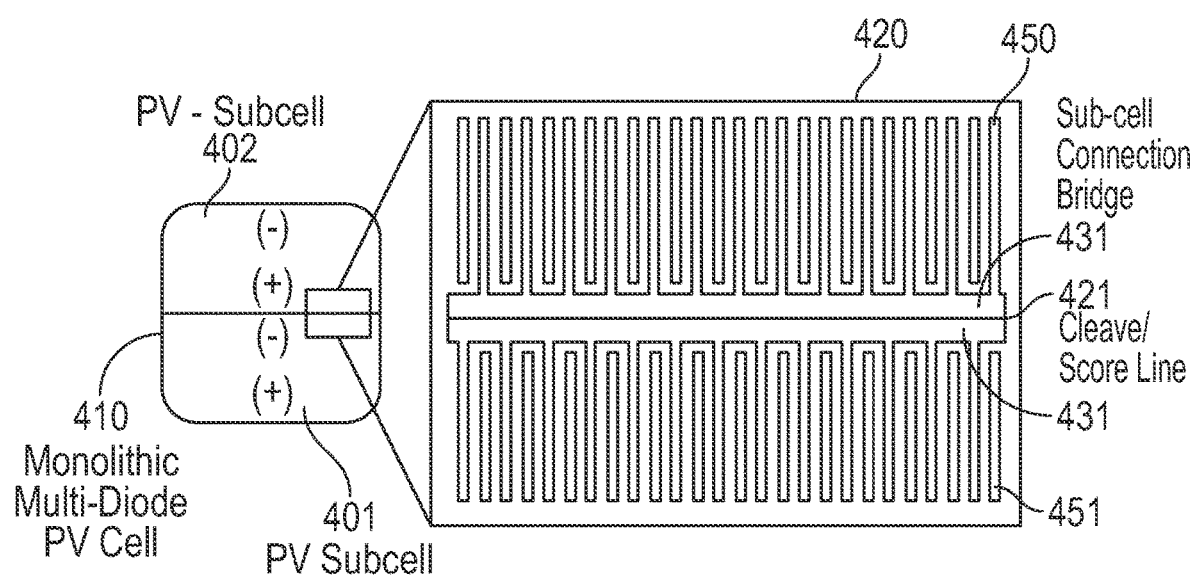
FIG. 4 illustrates a multi-diode PV cell having a single scribed cleave between two sub-cells of the multi-diode PV cell as may be employed according to some embodiments.

As noted above, single-diode and/or multi-diode PV cells may be employed in embodiments. Multi-diode PV cells may be created by scribing then cleaving a monolithic PV cell on a single silicon substrate. The two cleaved sections may then be electrically reconnected via a connection bridge 431 as shown in FIG. 4. Current and voltage may be doubled and halved respectively when the PV cell is divided in this way. In some embodiments, strings of multi-diode PV cells may be employed in PV laminates and PV modules and can have the effect of changing the sizing of connections of the PV laminate depending upon the design current and voltage resulting from the use of multi-diode PV cells.

PV modules or laminates with single diode PV cells may have the same voltage and current outputs as those employing multi-diode PV cells but the internal interconnections of those employing multi-diode PV cells may be relatively undersized because of potential lower currents in the later. This reduced current can result in reduced resistive losses reduced by multiples of two or more when comparing single diode PV cell and multi-diode PV cells. A balance, however, may be struck between further sectioning a PV cell and the reduced current that can result because multi-diode PV cells can have less surface area and may suffer from inefficiencies derived from the scoring and cleaving performed during manufacture. For example, some amount of current carried with multi-diode PV cells is reduced. Likewise, metallization of a cell or within a string of cells would also be reduced when half cells are used. And, laser damage from cutting PV cells in half create recombination on the edge. Accordingly, while resistance losses from current values may be reduced, losses from other sources may be increased when a single diode PV cell is cleaved more than once.

As cross-tied PV cells share a voltage value, spacing between single-diode and/or multi-diode PV cells can be reduced. In embodiments, adjacent strings of cross-tied legs of PV cells may be placed closer together than if they were not cross tied because of the shared voltage potential experienced by the cross-tied PV cells.

Figure 7:
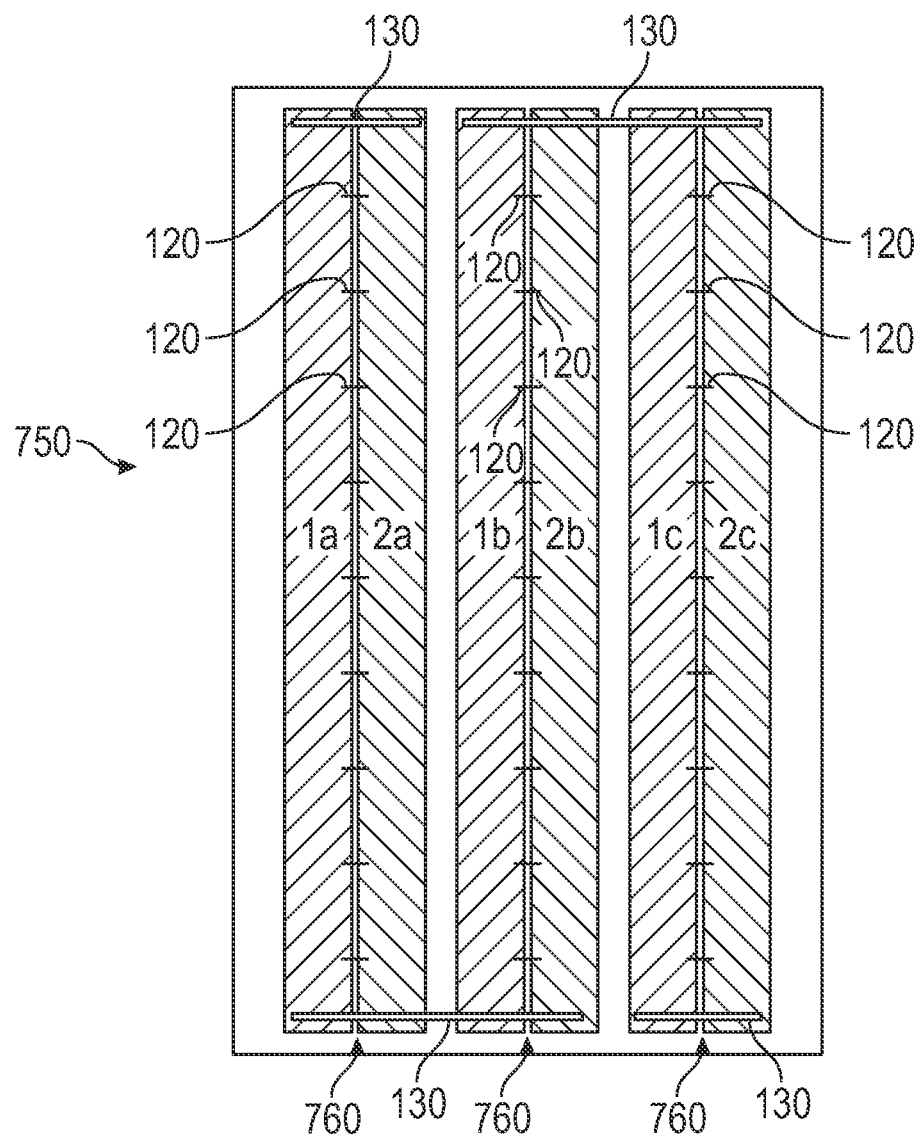
FIG. 7 illustrates a PV module and the spacing of paired columns of PV cells interconnected with cross-ties as may be employed according to some embodiments.

Embodiments may include various PV cell string layouts. These PV cell strings may be serpentine from edge to edge of a PV laminate or PV module and may be serpentine from edge to midline to edge of a PV laminate or PV module. The strings may not be serpentine at all and may comprise lines or curves or other somewhat straight layouts without U-turns. Embodiments may comprise columns of strings positioned in such a way as to have an internal home run connection to place both external connectors of the PV laminate or PV module near each other; and other layouts as well. The various sections of a string between turns may be referred to as legs of the string. An example of a serpentine string having three legs is shown in FIG. 1 and FIG. 7. String 180 in FIG. 1 has three legs and the paired strings 760 of FIG. 7 each has three legs as well.

Cross-tie connectors or interconnectors, which are used interchangeably herein, may comprise various conductive materials such as aluminum, copper, gold, silver, and other conductive metals, as well as partially conductive materials such as doped silicon.

As shown in the Figures, cross-tie interconnections may be located at various positions on the PV module or PV laminate. The cross-tie interconnections may be located on every pair of cells, on every other pair of cells, on paired cells located in the corners of a PV module, on bands of cells located across the PV module, and at various other locations as well. Cross-tie interconnection locations may be selected using the cell output and anticipated shading conditions. Other factors such as: manufacturability access to the underlying circuit; the speed of cross-tie application versus the desired Units Per Hour (UPH) of the line; balancing the increased risk of accidental shorting vs the benefit of cross tying; determining if required number of cross-ties is sufficient to resist string movement and maintain the targeted spacing; and an economic analysis of increased material usage that only impacts module field performance and does not have a benefit for STC flash power, may also be used individually, in different groupings and/or cumulatively to determine cross-tie interconnection locations.

Embodiments may include sequential and/or shingled PV cell arrays as well as three, four, five, six, seven, and eight or more parallel arrays of sequential and/or shingled or other PV cells. As noted above, cross-tied PV cells would be parallel and therefore share the same voltage. Having this same electrical potential, the two cross-tied PV cells may be positioned closer to each other than if they had differing electrical potentials. In some embodiments, the edges of the cross-tied PV cells could be less than one millimeter apart, e.g., 0.5 mm or 0.6 mm, or 0.7 mm, etc., while in others the edges could touch, and in some embodiments the cross-tied PV cells could overlap each other. In an overlap situation additional structural support to the overlying PV cell may need to be provided to retard or prevent cracking of the upper or lower PV cell. These supports can include mechanical spacers made of foam, compressible polymers, polymers, ceramics and metals. Preferably the structural supports may be light in weight, durable, and provide little to no abrasion on the surfaces of the PV cells. Still other tolerances may be used. In certain manufacturing tolerances, the spacing could be as close as possible without the possibility of cell overlap, which may be 0.5 mm (as noted above), is achievable. Spacing may depend on whether a cross tie is applied within a stringer, where even tighter tolerances might be achievable (e.g., 0.2 mm). Comparably, at a layup level, where strings can bow and are subjected to layup, tolerances could be closer to 0.5-1 mm spacing. Also, if cross-tied within a stringer, in certain instances a parallelized string pair may have an increased likelihood of resulting in more straight interconnections because of the leverage of having an effectively wider stance.

When adjacent or nearby PV cells are not cross-tied, and therefore have differing electrical potentials, a minimum spacing to avoid arcing or other shorting is suitable. Various target values for minimum spacing may be selected.

Multi-diode cells, which can include monolithic multi-diode (MMD), can comprise sub-cells on a shared substrate and/or may be coupled by a metallization structure cross-tie. Examples of the PV MMDs can be found in U.S. Pat. No. 10,608,113 and examples of the foil-based metallization cross-tie structures can be found in U.S. patent publication US20190312156A1, each of which is incorporated by reference into this application. FIGS. 9A through 13 also provide foil-based metallization cross-tie and/or PV cell design techniques that may be employed in embodiments.

Metallization methods, structures and systems which may also be employed in part or in full in embodiments are described in further detail in U.S. provisional application 63/034,761, which was filed on Jun. 15, 2020 and is entitled Composite Masking Between Solar Cells. The '761 application is incorporated by reference herein in its entirety.

As used herein, a monolithic PV cell refers to a single substrate PV cell. Multiple PV sub-cells may be formed on the single substrate through etching and cleaving and bridging the created divide. FIG. 4 shows a monolithic multi-diode PV cell 410 with two PV cell sub-cells 401, 402 (i.e., two PV half-cells). Quarter cells, eighth cells, etc. may also be present on a substrate. As noted above, as the additional PV sub-cells are created through etching and cleaving or other division methods, power efficiencies may be compromised because of the loss of light receiving surface area and the damage near the etching and cleaving. Accordingly, embodiments may also employ cross-tie connections between PV cells that are divided in other ways, such as half-cut or otherwise divided PV cells.

Embodiments may comprise a photovoltaic (PV) laminate comprising a first string of single-diode and/or multi-diode PV cells, the PV cells of the first string interconnected in series with each other, each of the first-string PV cells having a light receiving surface; and a second string of single-diode and/or multi-diode PV cells, the PV cells of the second string interconnected in series with each other, each of the second-string PV cells having a light receiving surface. In some instances, one PV cell of the first string is paired to one PV cell of the second string with a cross-tie electrical interconnection, the cross-tie interconnection forming a parallel electrical connection between the paired PV cells. The PV laminate may also comprise power management circuitry electrically connected to the first string and the second string and in some embodiments the paired PV cells are adjacent to each other. Other features of embodiments may comprise having the first string of PV cells and the second string of PV cells are adjacent to each other and/or light receiving surfaces of the first string of PV cells and light receiving surfaces of the second string of PV cells being positioned along a shared reference plane. Still further, in some embodiments a plurality of PV cells of the first string can be paired to a different PV cell of the second string with a cross-tie electrical connection, the cross-tie interconnection forming a parallel electrical connection between the paired PV cells. And in some embodiments, a separation distance between a PV cell of the first string of PV cells adjacent to a PV cell of the second string may be no more than one and one-half millimeter.

In some embodiments, a first electrical interconnection between two PV cells of a first PV string and a second electrical interconnection between two PV cells of a second PV may have a cross-tie electrical interconnection between them. And, in some embodiments, the PV cells of the first string may comprise one or more monolithic substrate multi-diode PV cells and the PV cells of the second string may comprise one or more monolithic substrate multi-diode PV cells. This monolithic substrate may be silicon.

In some embodiments, a first string of PV cells and a second string of PV cells may be adjacent to each other as a pair and have a serpentine placement on a PV laminate. And, in some embodiments, there may be a first minimum distance between PV cells of the first pair and a second minimum distance between PV cells of adjacent pairs, the second minimum distance being greater than the first minimum distance.

Embodiments may also encompass a photovoltaic (PV) module comprising a first string of single-diode and/or multi-diode PV cells, the PV cells of the first string connected in series with each other, each of the PV cells of the first-string having a light receiving surface; a second string of multi-diode PV cells, each of the PV cells of the second string connected in series with each other, each of the PV cells of the second-string having a light receiving surface; and electrical power circuitry electrically coupled to the first string of PV cells and the second string of PV cells. In some embodiments, one PV cell of the first string may be paired to one PV cell of the second string with a cross-tie electrical connection, the cross-tie connection forming a parallel electrical connection between the paired PV cells. In some embodiments, paired PV cells may be adjacent to each other. In some embodiments a first string of PV cells and a second string of PV cells may be adjacent to each other and may be positioned on the PV module in a U-shape.

In embodiments, light receiving surfaces of a first string of PV cells and light receiving surfaces of a second string of PV cells may each be positioned along a shared reference plane and/or a plurality of PV cells of the first string may be each paired to a different PV cell of the second string with a cross-tie electrical connection, the cross-tie connection forming a parallel electrical connection between the paired PV cells.

In embodiments, a separation distance between a PV cell of a first string adjacent to a PV cell of a second string may be no more than one and one-half millimeter or smaller. In embodiments a first electrical interconnection between two PV cells of a first PV string and a second electrical interconnection between two PV cells of a second PV may have a cross-tie electrical interconnection between them.

In embodiments, strings of PV cells may be adjacent to each other as a first pair and this pair may have a serpentine placement on the PV module or PV laminate. There may also be a first minimum distance between PV cells of the first pair and a second minimum distance between PV cells of adjacent pairs, the second minimum distance being greater than the first minimum distance.

In embodiments, a PV module may comprise multi-diode PV cells of a first string with monolithic silicon substrate. Embodiments may also include PV laminates comprising a first string of PV cells, the PV cells of the first string connected in series with each other, each of the first-string PV cells having a light receiving surface; and a second string of PV cells, the PV cells of the second string connected in series with each other, each of the second-string PV cells having a light receiving surface. In some instances, one PV cell of the first string may be paired to one PV cell of the second string with a cross-tie electrical connection, the cross-tie connection forming a parallel electrical connection between the paired PV cells. Power management circuitry electrically connected to the first string and the second string may also be present and/or paired PV cells may be adjacent to each other. In some embodiments, light receiving surfaces of a first string of PV cells and light receiving surfaces of a second string of PV cells may be each positioned along a shared reference plane. Also, pluralities of PV cells of a first string may each be paired to a different PV cell of a second string with a cross-tie electrical connection, the cross-tie connection forming a parallel electrical connection between the paired PV cells. In some embodiments, a separation distance between a PV cell of a first string of PV cells adjacent to a PV cell of a second string may be no more than one and one-half millimeter, one millimeter, or one-half millimeter. And, in some embodiments, a first electrical connection between two PV cells of a first PV string and a second electrical connections between two PV cells of a second PV may have a cross-tie electrical interconnection between them.

Still further, some embodiments may comprise a first string of PV cells with a monolithic substrate multi-diode PV cell and PV cells of a second string comprising a monolithic substrate multi-diode PV cell. Also, in some embodiments a first string of PV cells and a second string of PV cells may be adjacent to each other as a pair and have a serpentine placement on the PV laminate. Here, in some instances, a first minimum distance between PV cells of the first pair and a second minimum distance between PV cells of adjacent pairs, where the second minimum distance may be greater than the first minimum distance.

Embodiments may also comprise a photovoltaic module comprising a first string of multi-diode PV cells, the PV cells of the first string connected in series with each other, each of the PV cells of the first-string having a light receiving surface; a second string of multi-diode PV cells, each of the PV cells of the second string connected in series with each other, each of the PV cells of the second-string having a light receiving surface; and electrical power circuitry electrically coupled to the first string of PV cells and the second string of PV cells, wherein one PV cell of the first string may be paired to one PV cell of the second string with a cross-tie electrical connection, the cross-tie connection forming a parallel electrical connection between the paired PV cells. Here, as in other embodiments, paired PV cells may be adjacent to each other; a first string of PV cells and a second string of PV cells may be adjacent to each other and may be positioned on the PV module in a U-shape; and light receiving surfaces of the first string of PV cells and light receiving surfaces of the second string of PV cells may each be positioned along a shared reference plane.

In some embodiments, a first string may be paired to a different PV cell of a second string with a cross-tie electrical connection, the cross-tie connection may form a parallel electrical connection between the paired PV cells. Also, in some embodiments, a separation distance between a PV cell of the first string adjacent to a PV cell of the second string may be no more than one and one-half millimeter, one millimeter, or one-half millimeter; and a multi-diode PV cell may comprise a monolithic silicon substrate.

FIG. 1 illustrates two strings (180 and 181) of multi-diode PV cells 110, forming a two-dimensional array of PV cells 110, with cross-tie interconnections 120 (CTC) between a portion of the multi-diode PV cells, as may be employed according to some embodiments. There are two strings shown: I 180 and II 181. These strings may reside on a PV laminate or a PV module and may reach the edges of either or may occupy a smaller area between edges of either. As can be seen, some of the PV cells in each string are interconnected with a cross-tie interconnection 120 (CTC) while others are not. String I is located in columns A, C and E while string II is located in columns B, D, and F. Both strings I and II are serpentine, being connected via electrical connectors 130 to form a serpentine string, and can run from edges of a PV laminate or PV module. There are three legs shown, where each leg contains parts of both strings 180 and 181: leg A-B; leg C-D; and leg E-F. The polarity of the PV cells is labelled in some of the PV cells of FIG. 1. See, for example, E3 and F3. See also sub-cells 121, 122, 111, and 112, which each identify portions of a multi-diode photovoltaic cell and the internal polarity within the multi-diode PV cell. Each of the cross-ties in FIG. 1 is shown between PV cells and not between PV cell interconnections as is shown in FIG. 3, for example.

In FIG. 1, distances $d_1$ and $d_2$ may be the same provided that the associated PV cells are similarly sized. Likewise, spaces $d_4$ and $d_{10}$ may be the same if connected and associated PV cells are similarly sized. However, spaces $d_2$ and $d_{10}$ need not be the same as these spaces may be differ due to the location of the PV cell on the PV module or PV laminate. Spacing $d_9$ and $d_5$ may be larger than spaces $d_4$ and 10 and spaces $d_1$ and $d_2$. Spaces $d_7$ and $d_8$ can be similar or different. Similar spacing may be preferred between PV cells here and elsewhere when the PV cells are the same size and share topologies. Different spacing may be preferred when there is a different topology in adjacent PV cells and/or different loading conditions may be expected to be consistently experienced. Numeral 170 shows the CTC connection to the connection bridge of the multi-diode PV cells. Numeral 171 also shows the CTC connection to the connection bridge of the multi-diode PV cells. FIG. 4 shows an example of a connection bridge at 431.

FIG. 2 illustrates three strings of single-diode PV cells 210, forming a two-dimensional array of PV cells, with cross-ties between a portion of the PV cells 210, as may be employed according to some embodiments. There are three strings shown: I (180), II (181) and III (182). Columns A, B, and C have first legs 225 of the three strings while columns D, E and F, have second legs 226 of the three strings. Some of the PV cells 210 in adjacent strings are interconnected with a cross-tie connection while others are not. String I is located in columns A and D while string II is located in columns B and E and string III is located in columns C and F. Strings I, II and III have a single U-turn and can run from edges of a PV laminate or PV module or be located on smaller areas of a PV laminate or PV module. Cross-tie connections are shown connecting PV cells in Strings I, II, and III. See, e.g., row 3. Leg 1 consists of columns A-B-C and leg 2 consists of columns D-E-F. As noted above, the spacing $d_{11}$, $d_{12}$, $d_{14}$ and $d_{15}$ may be similar or identical in embodiments and the spacing $d_{13}$ may be larger in embodiments. These spacings, $d_{11}$-$d_{15}$ may however, each be different or sometimes may be similar depending upon particular characteristics and/or uses of a particular PV laminate. For example, spacings $d_{11}$ and $d_{15}$ may be smaller than or equal to spacings $d_{12}$ and $d_{14}$ depending upon PV cell characteristics and/or interconnections. However, the spacing $d_{13}$ is preferably larger than either $d_{11}$, $d_{12}$, $d_{14}$, or $d_{15}$ because of the larger voltage difference experienced when legs A-C and D-F adjoin one another as shown in FIG. 2.

FIG. 3 illustrates six strings of multi-diode PV cells 110 forming a two-dimensional array of PV cells, with cross-tie interconnections 120 (CTC) between a portion of the multi-diode PV cells 110 and a portion of the PV cell interconnects, as may be employed according to some embodiments. The six strings of PV cells are labelled I-IV (180, 181, 182, 383, 384, and 385). No U-turn or serpentine layout is present in FIG. 3, rather the strings of FIG. 3 are a single leg and lie along a single line. Cross-tie connections between cell interconnections are shown between, for example, column B (391) lines 2 and 3 and column C lines 3 and 4. Polarity of the PV cells is also shown in various PV cells including (VI)(3) and (II)(2). Also labelled in FIG. 3 are column A 390, column C 392, multi-diode PV sub-cell portion 350, multi-diode PV sub-cell portion 351, multi-diode PV sub-cell portion 340, multi-diode PV sub-cell portion 341, multi-diode PV sub-cell portion 342, multi-diode PV sub-cell portion 343, multi-diode PV sub-cell portion 330, multi-diode PV sub-cell portion 331, multi-diode PV sub-cell portion 360, multi-diode PV sub-cell portion 361, multi-diode PV sub-cell portion 362, multi-diode PV sub-cell portion 363, and multi-diode PV sub-cell portion 364. These sub-cells are interconnected to each other along a cleave line and connection bridge, an example of which is shown in more detail in FIG. 4.

FIG. 4 illustrates a multi-diode PV cell 410 having a single scribed cleave 421 connection bridge 431 between two sections of the PV cell as may be employed according to some embodiments. The cleave etching line 421 lies along connection bridge 431. The connection bridge 431 between two sub-cells (401 and 402) is enlarged and shown in box 420. Box 420 also shows the circuitry 450 and 451 of the individual sub-cells 401 and 402. These sub-cell circuits are electrically connected via the connection bridge 431.

Figure 5:
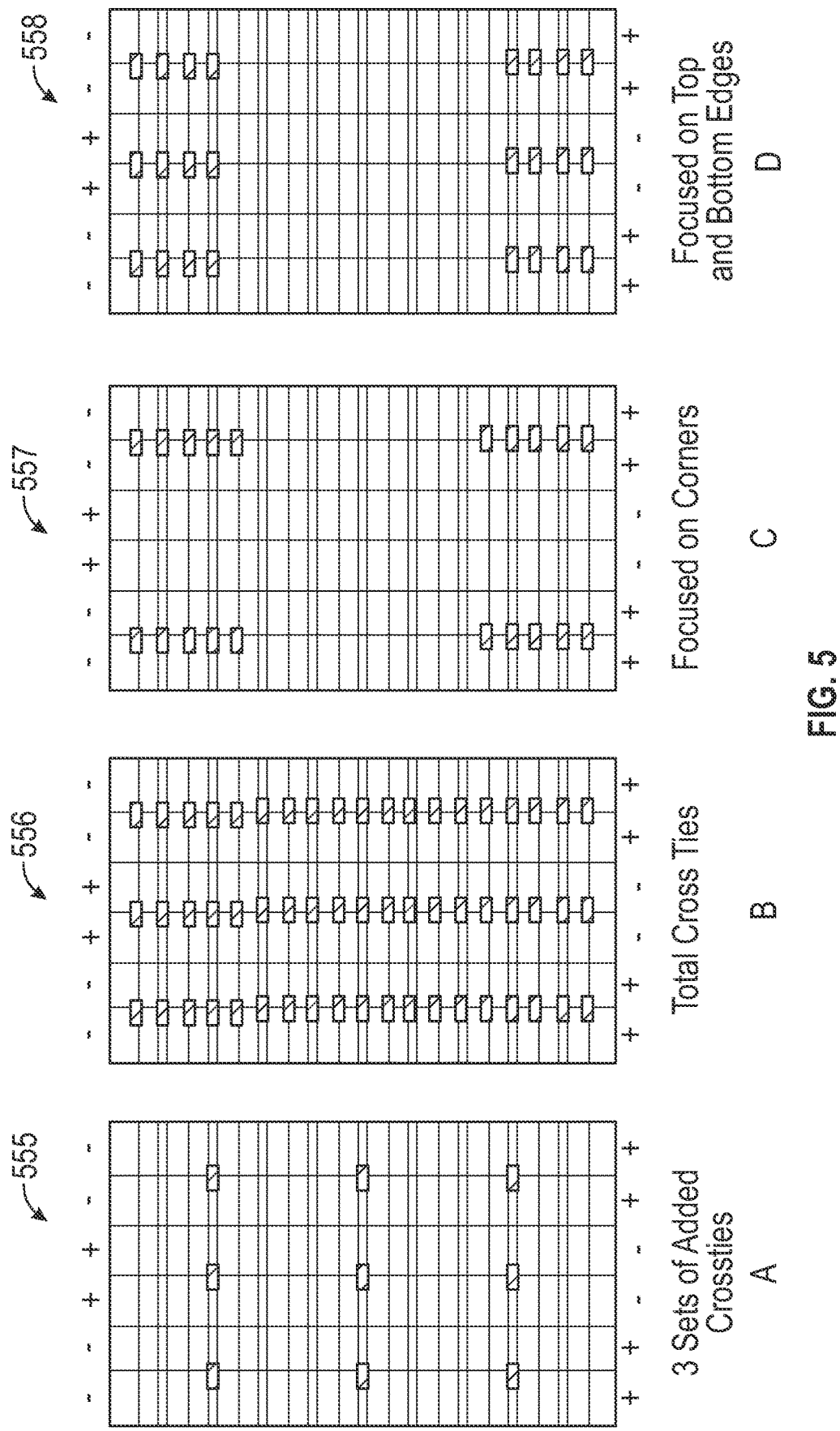
FIG. 5 illustrates numerous two-dimensional PV cell arrays, each with a different cross-tie configuration, as may be employed according to some embodiments.

FIG. 5 illustrates numerous two-dimensional PV cell arrays, each with a different cross-tie configuration, as may be employed according to some embodiments. Array A 555 shows three sets of added cross-ties between two serpentine strings of PV cells. The polarity of the turns of the serpentine strings are shown at the top and the bottom of each of Array A-D. Array B 556 shows cross-tie connections between each PV cell of the paired serpentine strings. Array C 557 shows cross-tie connections between PV cells near the U-turns of the serpentine array. Array D 558 shows cross-tie connections between PV cells near the U-turns of the serpentine array as well. The outer border of each array represents the edge of a PV laminate or PV module to which the array is a part of.

Figure 6:
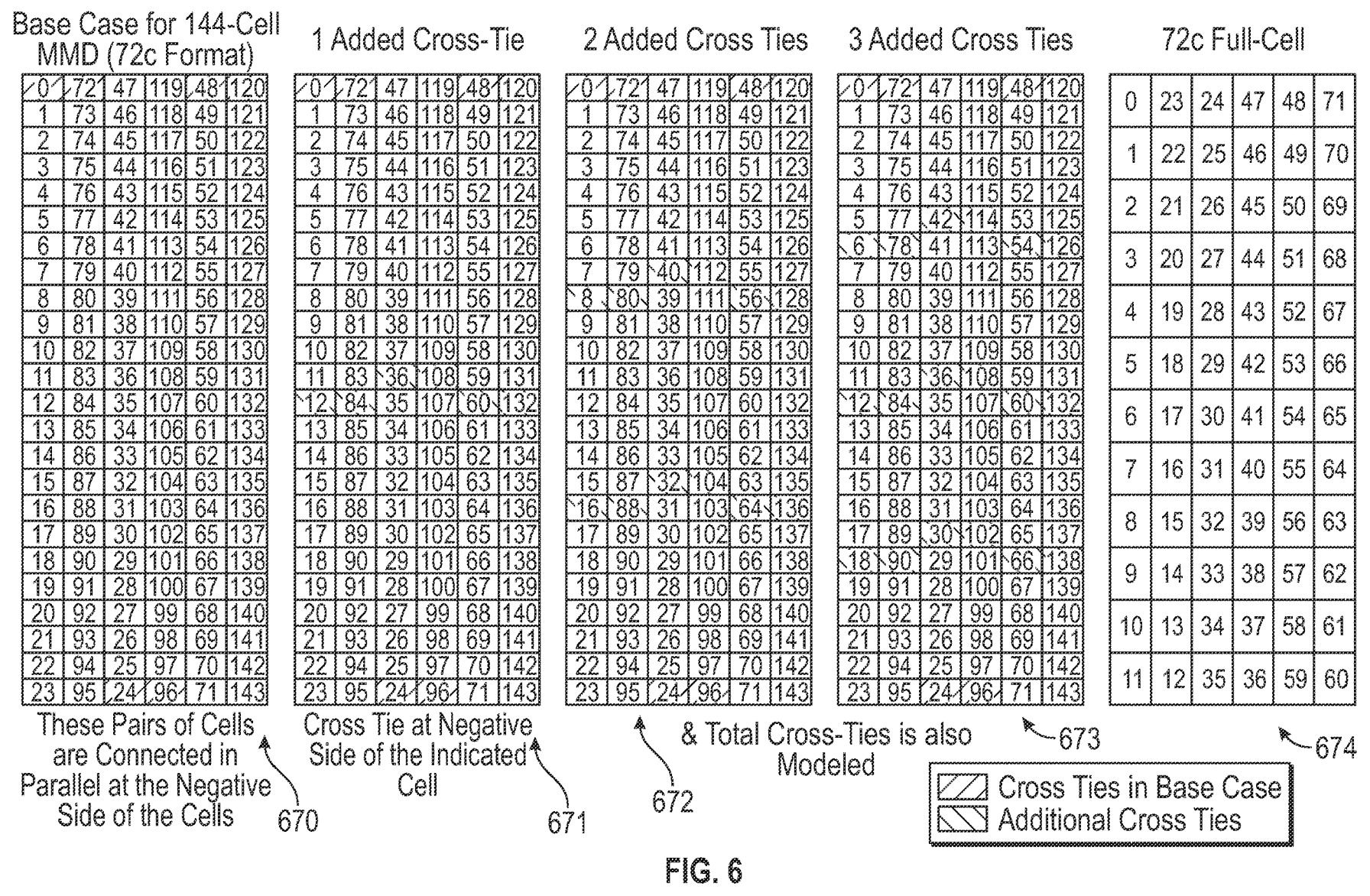

FIG. 6 illustrates PV laminates showing cell numbering and cell layout with cross-ties, which may be employed for PV module management and/or design, as may be employed according to some embodiments. Layout 670 shows pairs of PV cells interconnected in parallel at the negative side of the PV cells in a base case with 144-cell MMD (72C format). Layout 671 shows cross-ties at negative side of indicated PV cells and one added cross tie. Layout 672 shows two added cross ties and layout 673 shows three added cross ties. Layout 674 shows 72 cell full-cell layout for laminates as may also be employed in embodiments.

FIG. 7 illustrates a PV laminate 750 and the spacing of paired columns 760 of multi-diode PV cells interconnected with cross-ties 120 as may be employed according to some embodiments. Strings 1*a* and 2*a* are shown paired together and connected in serpentine fashion to 1*b* and 2*b* and then 1*b* and 2 are shown connected to 1*c* and 2*c*. The different spacing between 1*a* and 1*b* and 2*a* and 1*b* is shown with the spacing between 1*a* and 1*b* being smaller than the spacing between 2*a* and 1*b* because 1*a* and 1*b* are cross-tied while 2*a* and 1*b* are not cross-tied. Likewise, the spacing between 2*b* and 1*c* is larger because these two are not cross-tied and 1*c* and 2*c* are closer because they are cross-tied.

Figure 8:
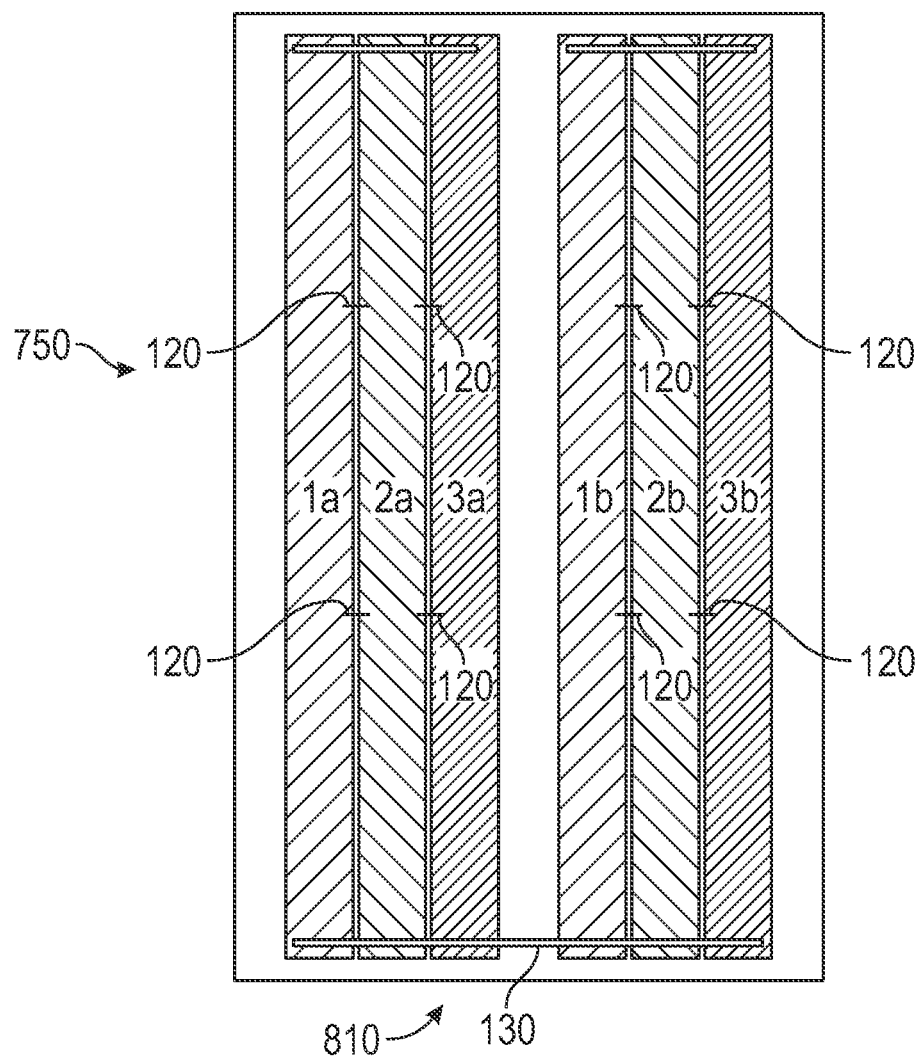
FIG. 8 illustrates a PV module and the spacing of triple columns of PV cells interconnected with cross-ties as may be employed according to some embodiments.

FIG. 8 illustrates a PV laminate 750 and the spacing of triple columns of PV cells interconnected with cross-ties 120 as may be employed according to some embodiments. There is a single U-turn 810 shown at the bottom of the PV module. The spacing is tighter between 1*a*, 2*a*, and 3*a* than between 3*a* and 1*b* because 1*a*, 2*a*, and 3*a* are cross-tied while 3*a* and 1*b* are not cross-tied.

Figure 9A:
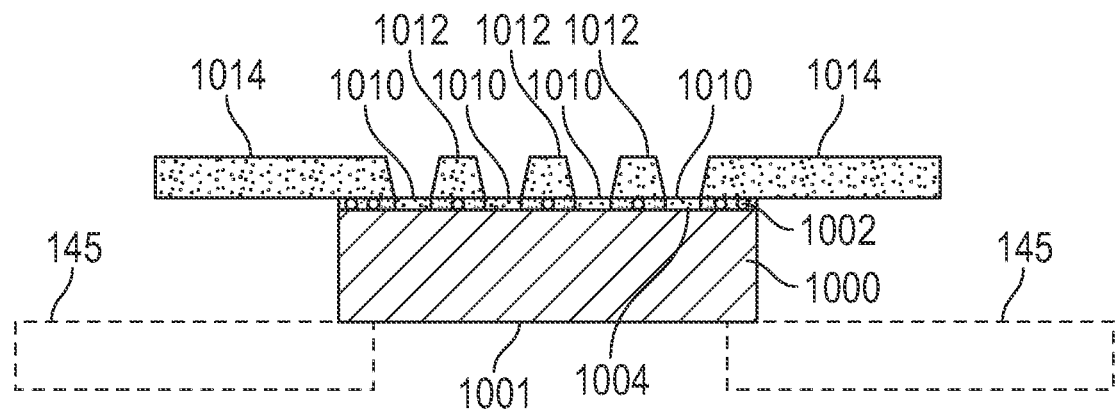
FIG. 9A-9B illustrate a side view of a PV cell including foil structure connections as can be employed according to some embodiments.
Figure 9B:
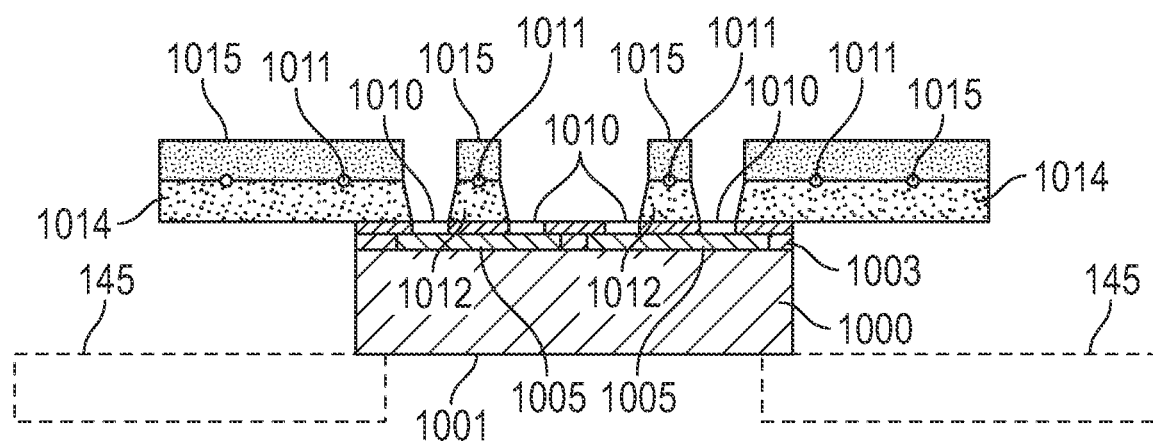

FIGS. 9A-9B, a side view, illustrate foil structure connections that can include a composite mask for making interconnections according to some embodiments. These foil structure connections may be formed through laser etching. Exposing metal foil to a laser beam forms a plurality of conductive contact structures 1010 electrically connected to the semiconductor regions in or above the substrate 1000. In embodiments, foil structure interconnections can include a locally deposited metal. As shown, the edge portions 1014 can also be referred to as interconnect portions that can electrically connect one solar cell to another solar cell. In one example, coupling one solar cell to another solar cell in this manner can form a solar cell string, achieving a parallel or series electrical relationship between the cells. In a particular embodiment, the overhang portion can represent a foil portion that is sufficiently large to overlap with one or more additional cells for metallization of the one or more additional cells. In an example, a single piece and/or sheet of foil can be used for a plurality of solar cells (e.g., 2, 3 or more solar cells) in this manner. In an embodiment, two or more cells can be connected together by their respective edge portions 1014. For example, the edge portions 1014 from adjacent cells can be connected by various processes. In another example, substrates 1000 can have individual edge portions 1014. These individual edge portions 1014 can be bonded and/or welded together to electrically connect one substrate to another, e.g., to form a solar cell string such as a super cell or hypercell. In some examples, the individual edge portions 1014 can be attached together using a conductive adhesive, tacking process, stamping process and/or any other type of applicable attachment process. Also labelled in FIGS. 9A and 9B are contact structures 1010, intervening layer 1002, light receiving side 1001, metal source 1015, bond 1011, metal foil portion 1012, via 1004, contact structure 1005, and metal foil portion 1003. In embodiments, a composite mask 145 can cover the individual interconnect or edge portions 1014 as shown. In embodiments, the composite mask 145 can include a first layer and a second layer as described herein or otherwise.

Figure 10:
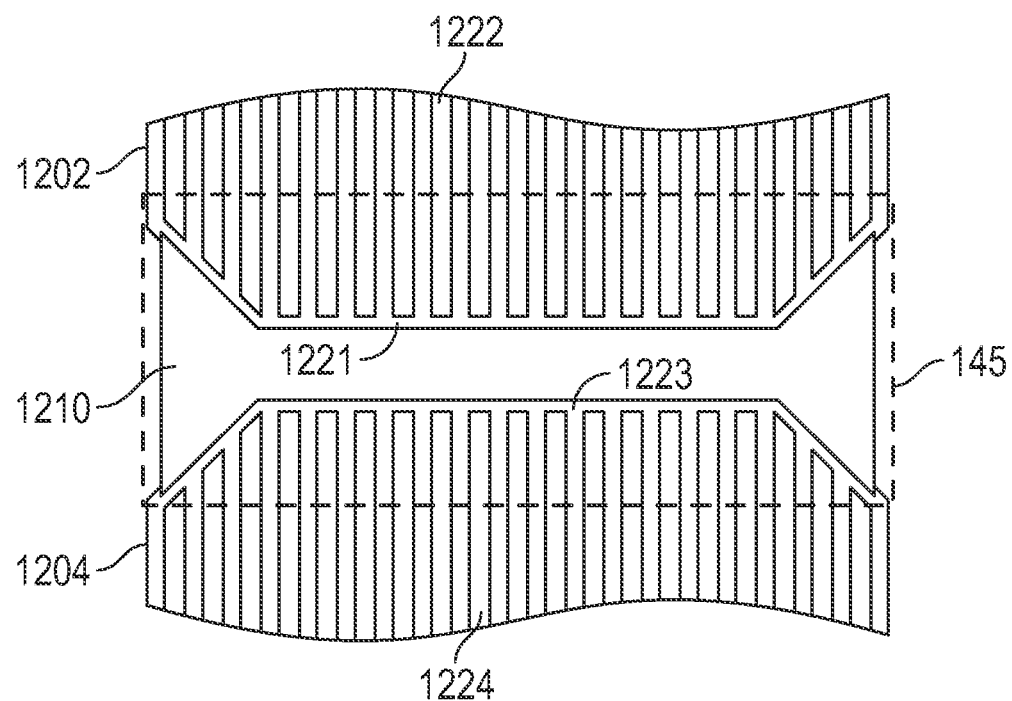
FIG. 10 illustrates a plan view of a section of a PV cell string including a dog bone connection as may be employed according to some embodiments.

FIG. 10 illustrates a dog-bone connection that can include a composite mask according to some embodiments. The first interconnect 1210 can have a dog-bone shape as shown. FIG. 10 is a single interconnect having that shape rather than multiple interconnects collectively having that shape. As shown, the solar cells in the example of FIG. 10 are pad-less solar cells 1202, 1204. In an embodiment, the first interconnect 1210 can be welded to metal regions 1221, 1223 of the solar cells 1202,1204. In some embodiments, a laser process can be used to weld the first interconnect 1210 to metal regions 1221, 1223 of the first and second solar cell 1202, 1204. In an example, the metal regions 1221, 1223 can include contact fingers 1222, 1224. In embodiments, first interconnect 1210 can include a metal foil. In embodiments, first interconnect 1210 can include aluminum and/or aluminum foil. In embodiments, the first interconnect 1210 can be substantially planar with the metal regions 1221, 1223 and/or the first and second solar cell 1202, 1204. In one embodiment, to connect pad-less solar cells 1202, 1204 together, a tab-less interconnect can be used, such as the one illustrated in FIG. 9. In embodiments, the first interconnect 1210 can have a layer of nickel and/or zincate. In embodiments, the layer of nickel and/or zincate can be formed by a cladding process. In embodiments, a composite mask 145 can cover first interconnect 1210 as shown. In embodiments, the composite mask 145 can include a first layer and a second layer as described in detail above.

Figure 11:
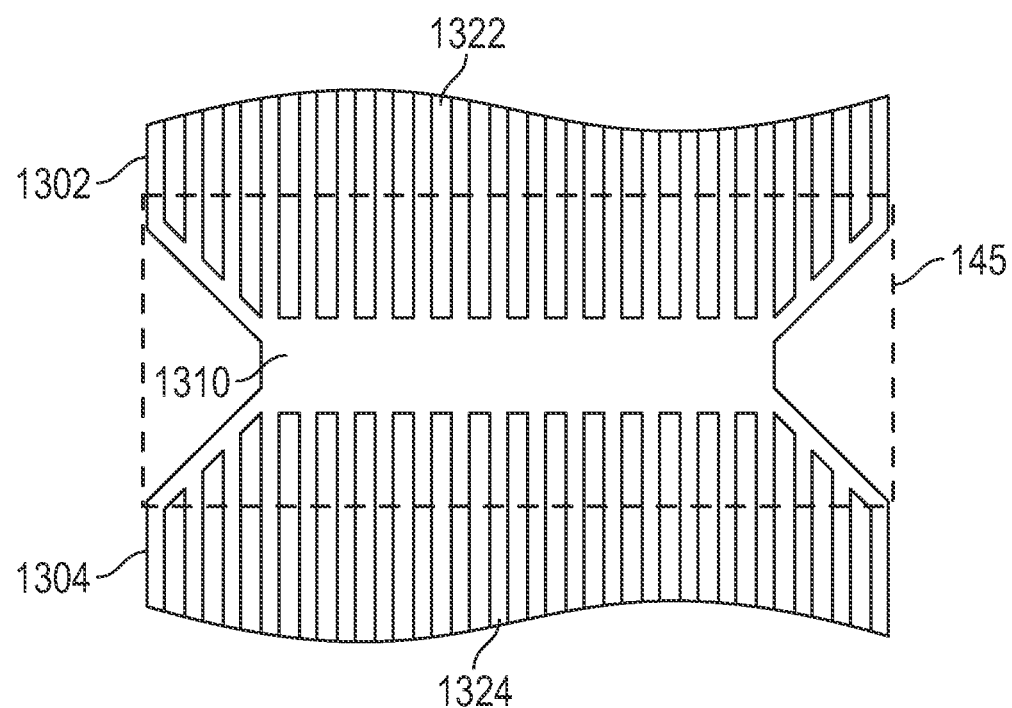
FIG. 11 illustrates a top view of a section of a PV cell string including a foil connection as may be employed according to some embodiments.

FIG. 11 illustrates a foil connection, which may be employed and can include a composite mask according to some embodiments. An example of solar cells connected together by a conductive foil having an anodized region is shown, according to some embodiments. FIG. 11 shows the solar cells 1302, 1304 from back sides of the solar cells 1302, 1304, where the solar cells 1302, 1304 can have front sides which face the sun during normal operation and back sides is opposite the front sides. In an embodiment, the conductive foil 1310 can connect a first solar cell 1302 to a second solar cell 1304. As shown, the solar cells 1302, 1304, in the example of FIG. 11 are pad-less solar cells 1302, 1304. In embodiments, the conductive foil 1310 can include contact fingers 1322, 1324. In embodiments, conductive foil 1310 can include a metal foil. In embodiments, conductive foil 1310 can be aluminum and can be an aluminum foil. In some embodiments, the conductive foil 1310 can be rolled over from the first solar cell 1302 to the second solar cell 1304. In some embodiments, a laser process can be used to weld the conductive foil 1310 to the first and second solar cell 1302, 1304. In embodiments, the conductive foil 1310 can have a layer of copper, titanium, tin, aluminum, nickel and/or zincate. In embodiments, the layer of nickel and/or zincate can be formed by a cladding process. In embodiments, the copper and tin can be formed by a plating process. In embodiments, a composite mask 145 can cover conductive foil 1310 as shown. In embodiments, the composite mask 145 can include a first layer and a second layer as described in detail above.

Figure 12:
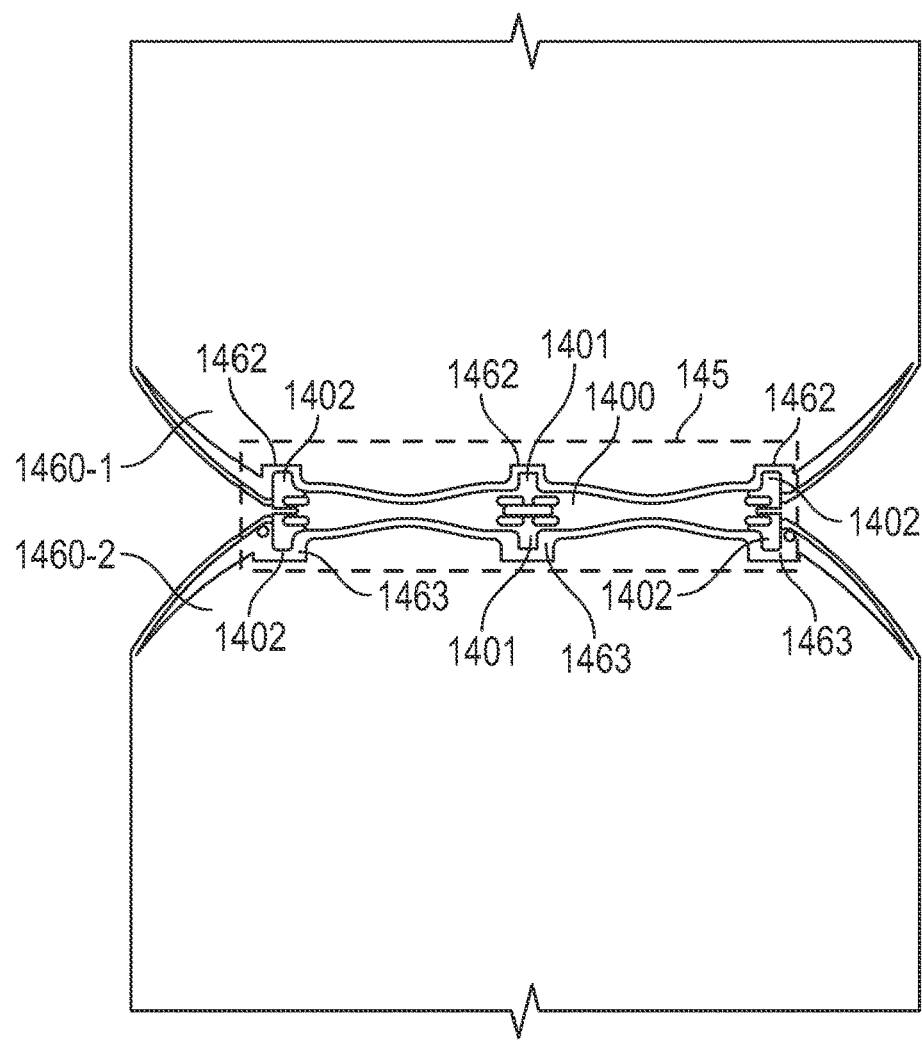
FIG. 12 illustrates a top view of a section of a PV cell string including a dog bone connection as may be employed according to some embodiments.

FIG. 12 illustrates a dog-bone connection can include a composite mask according to some embodiments. In the example of FIG. 12, tabs 1402 and 1401 of the interconnect 1400, electrically connect positive pads 1463 of the solar cell 1460-2 to the negative pads 1462 of the solar cell 1460-1, on the back sides of the solar cells. As is well understood, the front side of a solar cell faces the sun to collect solar radiation during normal operation; the back side is opposite the front side. In embodiments, a composite mask 145 can cover the interconnect 1400 as shown. In embodiments, the composite mask 145 can include a first layer and a second layer as described herein.

Figure 13:
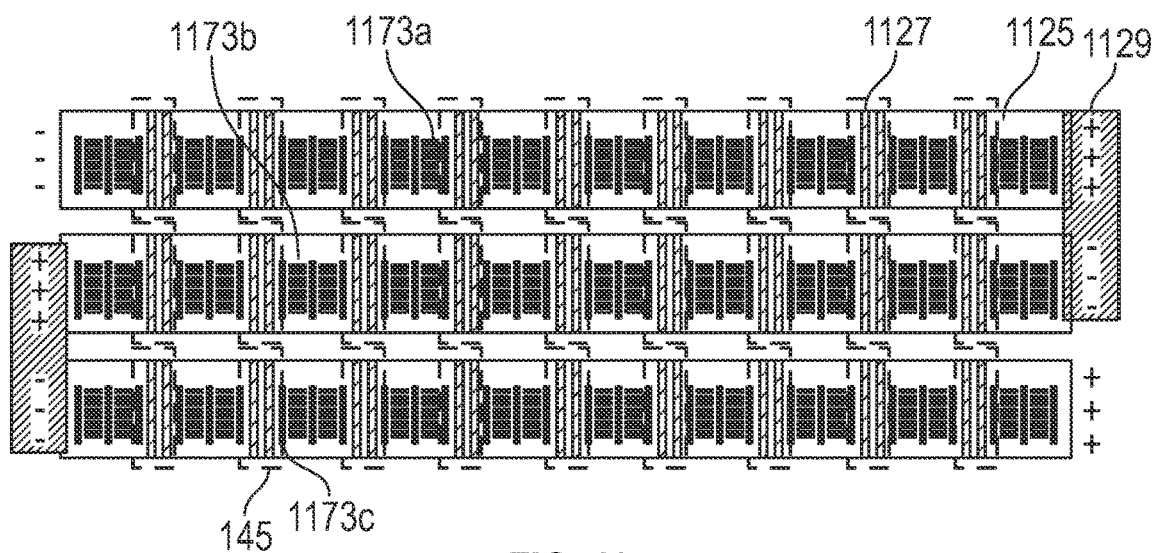
FIG. 13 illustrates a top view of foil structure connections that can include composite masking as may be employed according to some embodiments.

FIG. 13 illustrates foil structure connections can include composite mask according to some embodiments. In FIG. 13, a substantial portion of the metal foil disposed over individual PV cells 1125 can be removed. In an example, portions of metal foil and/or interconnect portions 1127 located between adjacent PV cells 1125 can be maintained to create a set of three solar cell strings 1173a, 1173b, 1173e connected in series. A plurality of solar cell strings, e.g., one, two, three, four or more solar cells strings can be connected in this manner. In an embodiment, the portions of metal foil 1127 can be interconnecting portions 1127 or referred to as interconnects 1127. In an embodiment, the interconnecting portions 1127 can be disposed partially over edges of the PV cells 1125 and as well as disposed between PV cells 1125 and can be connected. Busbar portions 1129, can connect two or more solar cell strings together as shown. In an example, the busbar portion 1129 can connect the PV cell strings 1173a, 1173b, 1173e in series or parallel arrangements. In certain embodiments, the methods described herein can include forming the interconnecting portions 1127, busbar portions 1129 and/or other portions from the metal foil. For example, with the interconnecting portions 1127 and busbar portions 129 can include conductive contact structures. The busbar portions 1129 can be rolled, folded and/or trimmed in a subsequent process, after forming locally deposited metal or after a LAMP technique is applied. By rolling, folding or trimming the busbar portions 1129, a space between a solar cell 1125 and an edge of module constructed therefrom can be minimized. In embodiments, a composite mask 145 can cover the metal foil and/or interconnect portions 1127 as shown. In embodiments, the composite mask 145 can include a first layer and a second layer as described herein.

Figure 14:
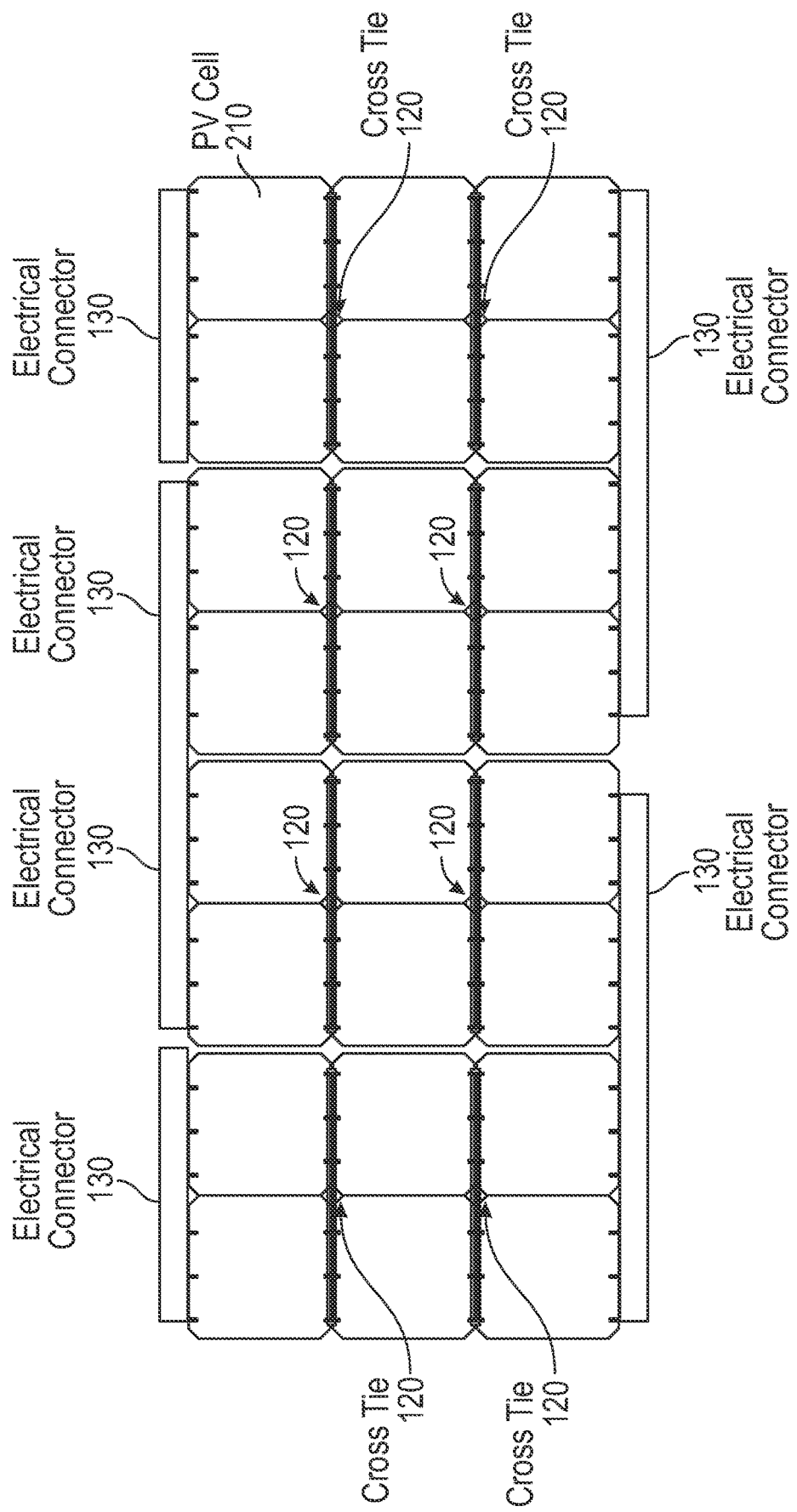
FIG. 14 illustrates two strings of PV cells aligned in a serpentine fashion and forming a two-dimensional array of PV cells, with cross-ties between PV cells, as may be employed according to some embodiments.
Figure 15:
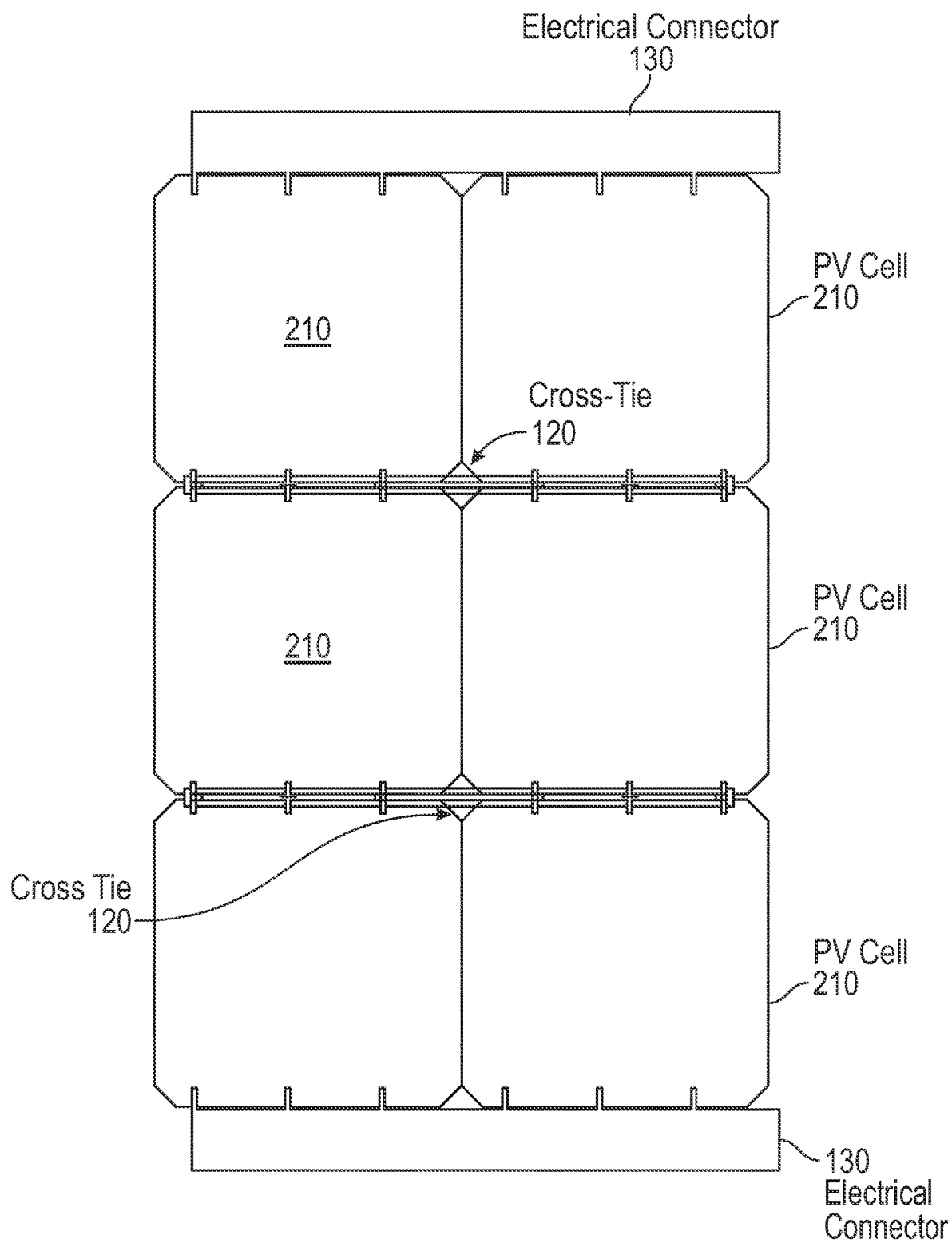
FIG. 15 illustrates two strings of PV cells, forming a two-dimensional array of PV cells, with cross-ties between a portion of the PV cells, as may be employed according to some embodiments.

FIG. 14 illustrates two strings of PV cells aligned in a serpentine fashion, forming a two-dimensional array of single-diode PV cells 210, with cross-ties between PV cells of adjacent strings, as may be employed according to some embodiments. The spacing of adjacent legs may be smaller when the legs are cross-tied than when they are not, as is shown in FIG. 14. FIG. 15 illustrates two strings of single-diode PV cells 210 in a single leg, forming a two-dimensional array of PV cells, with cross-ties between a portion of the single-diode PV cells, as may be employed according to some embodiments. Labelled in FIGS. 14 and 15 are electrical connectors 130, which interconnect individual legs of the strings of PV cells. Also labelled are PV cells 210 and cross-ties 120. As can be seen in FIG. 14, the PV cells are connected with the electrical connectors 13 in a serpentine pattern where PV cells in the same vertical column are interconnected with cross-ties 120 and adjacent columns (legs) of two are connected with electrical connectors 130.

FIG. 16 illustrates two strings (1801 and 1811) of single diode PV cells 210, forming a two-dimensional array of PV cells 210, with cross-tie interconnections 120 (CTC) between a portion of interconnections of the single-diode PV cells, as may be employed according to some embodiments. There are two strings shown: I 1801 and II 1811. These strings may reside on a PV laminate or a PV module and may reach the edges of either or may occupy a smaller area between edges of either. As can be seen, some of the PV cells in each string are interconnected with a cross-tie interconnection 120 (CTC) while others are not. In some embodiments all adjacent PV cells can be interconnected, see for example, FIG. 5B. String I is located in columns A, C and E while string II is located in columns B, D, and F. Both strings I and II are serpentine, being connected via electrical connectors 130 to form a serpentine string, and can run from edges of a PV laminate or PV module. There are three legs shown, where each leg contains parts of both strings 1801 and 1811: leg A-B; leg C-D; and leg E-F.

In FIG. 16, distances $d_1$ and $d_2$ may be the same provided that the associated PV cells are similarly sized. Likewise, spaces $d_4$ and $d_{10}$ may be the same if connected and associated PV cells are similarly sized. However, spaces $d_2$ and $d_{10}$ need not be the same as these spaces may be differ due to the location of the PV cell on the PV module or PV laminate. Spacing $d_9$ and $d_5$ may be larger than spaces $d_4$ and $d_{10}$ and spaces $d_1$ and $d_2$. Spaces $d_7$ and $d_8$ can be similar or different. Similar spacing may be preferred between PV cells here and elsewhere when the PV cells are the same size and share topologies. Different spacing may be preferred when there is a different topology in adjacent PV cells and/or different loading conditions may be expected to be consistently experienced.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic (PV) laminate comprising:
    a first serpentine string of PV cells, the first serpentine string of PV cells having first and second linear arrays of a plurality of PV cells aligned along sequential legs of the first serpentine string of PV cells, the first and second linear arrays of PV cells electrically connected in series with each other, each of the PV cells of the first serpentine string having a light receiving surface; and
    a second serpentine string of PV cells, the second serpentine string of PV cells having third and fourth linear arrays of a plurality of PV cells aligned along sequential legs of the second serpentine string of PV cells, the third and fourth linear arrays of PV cells electrically connected in series with each other, each of the PV cells of the second serpentine string having a light receiving surface, wherein one PV cell of the first linear array of the first serpentine string is paired to one PV cell of the third linear array of the second serpentine string with a cross-tie electrical connection, the cross-tie connection forming a parallel electrical connection between the paired PV cells.

2. The PV laminate of claim 1 further comprising:
power management circuitry electrically connected to the first serpentine string of PV cells and the second string of PV cells and wherein the first linear array, the second linear array, the third linear array, and the fourth linear array each lie along a straight line and wherein each comprise at least seven PV cells.

3. The PV laminate of claim 1 wherein the first linear array of the first serpentine string and the third linear array of the second serpentine string are adjacent to each other.

4. The PV laminate of claim 1 wherein the first linear array of the first serpentine string and the third linear array of the second string are parallel to each other.

5. The PV laminate of claim 1 wherein each light receiving surface of the first serpentine string of PV cells and each light receiving surface of the second string of PV cells are positioned along a shared reference plane.

6. The PV laminate of claim 1 wherein a plurality of PV cells of the first serpentine string are each paired to a different PV cell of the second string with a cross-tie electrical connection, the cross-tie connection forming a parallel electrical connection between the paired PV cells.

7. The PV laminate of claim 1 wherein a separation distance between a PV cell of the first linear array of the first serpentine string of PV cells adjacent to a PV cell of the third linear array of the second string of PV cells is no more than one and one-half millimeter.

8. The PV laminate of claim 1 wherein a first electrical connection between two PV cells of the first serpentine string and a second electrical connection between two PV cells of the second serpentine string have a cross-tie electrical interconnection between the first electrical connection and the second electrical connection.

9. The PV laminate of claim 1 wherein each of the PV cells of the first liner array of PV cells comprise a multi-diode PV cell formed on a single shared planar surface of a monolithic substrate and each of the PV cells of the second linear array of PV cells comprise a multi-diode PV cell formed on a single shared planar surface of a monolithic substrate.

10. The PV laminate of claim 1 wherein the first linear array, the second linear array, the third linear array and the fourth linear array each comprise four PV cells.

11. A photovoltaic (PV) module comprising:
a first string of PV cells, the first string having a plurality of sections, each section of the first string comprising two or more PV cells electrically connected in series with each other, each section of the first string electrically connected solely in series with another section of the first string, each of the PV cells of the first string having a light receiving surface;
a second string of PV cells, the second string having a plurality of sections, each section comprising two or more PV cells electrically connected in series with each other, each section of the section electrically connected solely in series with another section of the second string, each of the PV cells of the second string having a light receiving surface; and electrical power circuitry electrically coupled to the first string of PV cells and the second string of PV cells, wherein one PV cell of the first section of the first string is paired to one PV cell of the first section of the second string with a cross-tie electrical connection, the cross-tie electrical connection forming a parallel electrical connection between these two paired PV cells.

12. The PV module of claim 11 wherein the paired PV cells are adjacent to each other and wherein each section of the plurality of sections in the first string and the second string comprises seven PV cells.

13. The PV module of claim 11 wherein the first section of the first string of PV cells and the first section of the second string of PV cells are adjacent and parallel to each other.

14. The PV module of claim 11 wherein light receiving surfaces of the first string of PV cells and light receiving surfaces of the second string of PV cells are each positioned along a shared reference plane.

15. The PV module of claim 11 wherein a plurality of PV cells of the first string are each paired to a different PV cell of the second string with a cross-tie electrical connection, the cross-tie connection forming a parallel electrical connection between the paired PV cells.

16. The PV module of claim 11 wherein a separation distance between a PV cell of the first string adjacent to a PV cell of the second string is no more than one and one-half millimeters.

17. The PV module of claim 11 wherein a first electrical connection between two PV cells of the first string and a second electrical connections between two PV cells of the second string has a cross-tie electrical interconnection between the first electrical connection and the second electrical connection.

18. The PV module of claim 11 wherein the sections of the first string of PV cells are electrically connected to each other solely in series and have a serpentine placement on the PV module and the sections of the second string of PV cells are electrically connected to each other solely in series and have a serpentine placement on the PV module.

19. The PV module of claim 11 wherein the first string of PV cells comprises a multi-diode PV cell, the multi-diode PV cell formed on a single planar surface of a monolithic silicon substrate.

20. A photovoltaic (PV) laminate comprising:
a first string of PV cells, the first string of PV cells having a plurality of multiple PV cell sections, each PV cell section being electrically connected in series with at least one other PV cell section of the first string of PV cells, the PV cell sections comprising two one-dimensional arrays, each of the PV cells of the first string having a light receiving surface; and
a second string of PV cells, the second string of PV cells having a plurality of multiple PV cell sections, each PV cell section being electrically connected in series with at least one other PV cell section of the second string of PV cells, the PV cell sections comprising two one dimensional array layout, each of the PV cells of the second string having a light receiving surface;
wherein at least one but no more than half of the PV cells of the first string are paired to a PV cell of the second string with a cross-tie electrical connection, the cross-tie connection forming a parallel electrical connection between the paired PV cells, and wherein a separation distance between a PV cell of the first string adjacent to a PV cell of the second string is no more than one and one-half millimeters.

* * * * *